United States Patent
Piao et al.

(10) Patent No.: US 10,991,622 B2
(45) Date of Patent: Apr. 27, 2021

(54) WAFER PROCESSING METHOD

(71) Applicant: DISCO CORPORATION, Tokyo (JP)

(72) Inventors: Meiyu Piao, Tokyo (JP); Kentaro Odanaka, Tokyo (JP); Masatoshi Wakahara, Tokyo (JP); Wakana Onoe, Tokyo (JP); Heidi Lan, Tokyo (JP)

(73) Assignee: DISCO CORPORTION, Tokyo (JP)

( * ) Notice: Subject to any disclaimer, the term of this patent is extended or adjusted under 35 U.S.C. 154(b) by 0 days.

(21) Appl. No.: 16/533,271

(22) Filed: Aug. 6, 2019

(65) Prior Publication Data
US 2020/0051862 A1   Feb. 13, 2020

(30) Foreign Application Priority Data

Aug. 7, 2018   (JP) .............................. JP2018-148312

(51) Int. Cl.
| | |
|---|---|
| *H01L 21/78* | (2006.01) |
| *H01L 21/3065* | (2006.01) |
| *H01L 21/683* | (2006.01) |
| *H01L 21/304* | (2006.01) |
| *H01L 21/308* | (2006.01) |

(52) U.S. Cl.
CPC ............ *H01L 21/78* (2013.01); *H01L 21/304* (2013.01); *H01L 21/308* (2013.01); *H01L 21/3065* (2013.01); *H01L 21/6836* (2013.01)

(58) Field of Classification Search
CPC ... H01L 21/78; H01L 21/304; H01L 21/3065; H01L 21/30; H01L 21/6836
See application file for complete search history.

(56) References Cited

U.S. PATENT DOCUMENTS

| | | | | |
|---|---|---|---|---|
| 9,076,860 | B1 * | 7/2015 | Lei ................... | H01L 21/02076 |
| 9,165,832 | B1 * | 10/2015 | Papanu ................ | H01L 21/78 |
| 9,299,611 | B2 * | 3/2016 | Lei ........................... | H01L 21/78 |
| 2016/0307851 | A1 * | 10/2016 | Ohura ................ | H01L 21/6836 |
| 2017/0076982 | A1 * | 3/2017 | Sakakura .......... | H01L 21/31127 |
| 2017/0092540 | A1 * | 3/2017 | Rohleder ............... | H01L 22/12 |

FOREIGN PATENT DOCUMENTS

JP   2016207737 A   12/2016

OTHER PUBLICATIONS

U.S. Appl. No. 16/533,222, filed Aug. 6, 2019.

* cited by examiner

*Primary Examiner* — Kyoung Lee
*Assistant Examiner* — Christina A Sylvia
(74) *Attorney, Agent, or Firm* — Greer, Burns & Crain, Ltd.

(57) ABSTRACT

A wafer processing method includes the following steps: forming, on a back side of a wafer including a device layer, a mask to be used in forming grooves in a substrate along streets from the back side of the wafer; applying plasma etching from the back side of the wafer through the mask to form the grooves in the substrate along the streets and to define chip regions surrounded by the grooves; immersing the wafer in water, to which ultrasonic vibrations are being applied, after the etching step, whereby the device layer is cracked or ruptured along outer peripheral edges of the chip regions; and bonding a tape to a front side of the wafer before performance of the water immersion step.

7 Claims, 7 Drawing Sheets

WAFER PROCESSING METHOD

BACKGROUND OF THE INVENTION

Field of the Invention

The present invention relates to a method of processing a wafer including a substrate and a device layer stacked over a surface of the substrate and configuring devices. The devices are formed in respective regions divided in the device layer by a plurality of intersecting streets.

Description of the Related Art

So-called plasma dicing has been conventionally employed to divide a wafer as a workpiece by plasma etching to increase the yield of chips per wafer by narrowing widths to be set as streets (intended division lines) on a surface of the wafer and also to shorten the time required for the processing.

In a wafer with devices formed thereon, on the other hand, a device layer formed of a circuit layer, which configures the devices, and an insulating layer also exists on streets, and with etching gas suited for etching silicon (a substrate), the wafer therefore involves a problem that etching of the device layer on the streets is very difficult. With a wafer having a test element group (TEG) formed primarily of a metal such as aluminum or copper on streets, there is a similar problem.

In Japanese Patent Laid-open No. 2016-207737, a method is disclosed as a solution for this problem. According to this method, a water-soluble resin layer is formed on a front side of a wafer, and after removal of the water-soluble resin layer on streets together with a device layer and a TEG by irradiation of a laser beam, plasma dicing is performed from the front side of the wafer.

SUMMARY OF THE INVENTION

Any attempt to completely remove a TEG, a device layer and the like by irradiation of a laser beam, however, requires significant power, leading to another problem of formation of affected regions in a substrate by the irradiation of the laser beam, and hence a reduction in flexural strength of device chips to be formed by division.

Further, if plasma dicing is performed from the front side of a wafer, there is a potential problem that, unless a mask is formed with a uniform thickness to protect devices, the mask may be removed at thin mask areas during plasma etching, resulting in exposure of the front side of the wafer and damage to the corresponding devices.

The present invention, therefore, has as an object thereof the provision of a method of processing a wafer, which upon dividing the wafer into chips, avoids a reduction in the flexural strength of the chips by irradiation of a laser beam and also avoids damage to devices in plasma dicing.

In accordance with an aspect of the present invention there is provided a wafer processing method including a substrate and a device layer stacked over a surface of the substrate, the wafer having devices formed in respective regions divided by a plurality of intersecting streets. The wafer processing method includes a mask forming step of forming, on a back side of the wafer, a mask to be used in forming a plurality of etched grooves in the substrate along the streets from the back side of the wafer, a plasma etching step of applying plasma etching from the back side of the wafer through the mask after performing the mask forming step, thereby forming the etched grooves in the substrate along the streets and defining chip regions surrounded by the etched grooves, a water immersion step of immersing the wafer in water, to which ultrasonic vibrations are being applied by an ultrasonic vibrator, after performing the plasma etching step, thereby forming cracks in the device layer along outer peripheral edges of the chip regions or rupturing the device layer along the outer peripheral edges of the chip regions, and a tape bonding step of bonding a tape to a front side of the wafer before performing at least the water immersion step. The devices are separated from the tape after the performing the water immersion step.

Preferably, the wafer processing method of the present invention further includes, before performing at least the water immersion step and the tape bonding step, a guide groove forming step of forming guide grooves in the device layer along the streets from the front side of the wafer by a cutting blade or a laser beam without allowing the guide grooves to reach the substrate.

Preferably, in the water immersion step, the wafer is immersed in a direction such that the ultrasonic vibrator and the back side of the wafer face each other.

The wafer processing method according to the present invention performs the mask forming step of forming, on the back side of the wafer, the mask to be used in forming etched grooves in the substrate along the streets from the back side of the wafer and the plasma etching step of applying plasma etching from the back side of the wafer rather than the front side of the wafer through the mask after the performing the mask forming step to form the etched grooves in the substrate along the streets, thereby avoiding the occurrence of a situation such that during the etching, the front side of the wafer is exposed at areas where the mask is thin, and the corresponding devices are damaged. After performing the plasma etching step, the wafer processing method according to the present invention also performs the water immersion step of immersing the wafer in water, to which ultrasonic vibrations are being applied by the ultrasonic vibrator, after performing the plasma etching step, thereby forming cracks in the device layer, which has not been processed by the plasma etching, along outer peripheral edges of the chip regions or rupturing the device layer along the outer peripheral edges of the chip regions, and the tape bonding step of bonding the tape to the front side of the wafer before performing at least the water immersion step. After performing the water immersion step, the devices are separated from the tape (for example, by picking up the device chips), whereby the device chips can be obtained. The wafer processing method according to the present invention, therefore, does not involve a problem of causing a reduction in the flexural strength of chips by the irradiation of a laser beam of high power.

The wafer processing method according to the present invention may further include, before the performing at least the water immersion step and tape bonding step, the guide groove forming step of forming guide grooves in the device layer along the streets from the front side of the wafer by the cutting blade or the laser beam without allowing the guide grooves to reach the substrate, so that with the guide grooves serving as starting points in the water immersion step, cracks are formed in the device layer or the device layer is ruptured. It is, therefore, possible to avoid damage to the devices and also to prevent the device layer from having dimensions greater than the regions (chip regions) surrounded by the etched grooves (protruding parts of the device layer from having larger dimensions).

In the water immersion step, the wafer is immersed in a direction so that the ultrasonic vibrator and the back side of the wafer face each other. This mode can facilitate to form cracks in the device layer of the wafer immersed in the water, to which ultrasonic vibrations are being applied, along the outer peripheral edges of the chip regions or to have the device layer ruptured along the outer peripheral edges of the chip regions.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A description will hereinafter be made about the individual steps of the wafer processing method according to the present invention when the processing method is performed to divide a wafer W depicted in FIG. 1 into chips including devices D.

Figure 1:
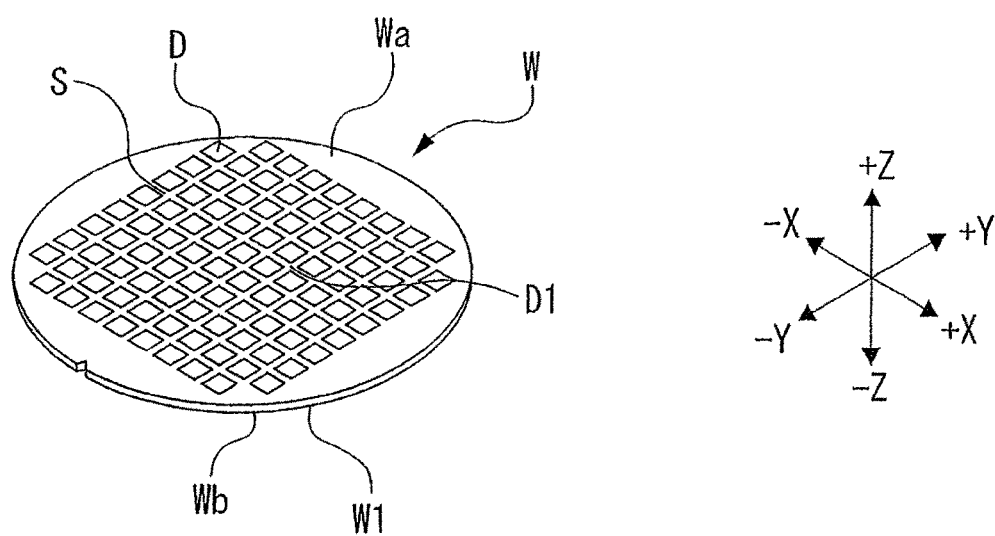
FIG. 1 is a perspective view depicting an example of a wafer.
Figure 2:
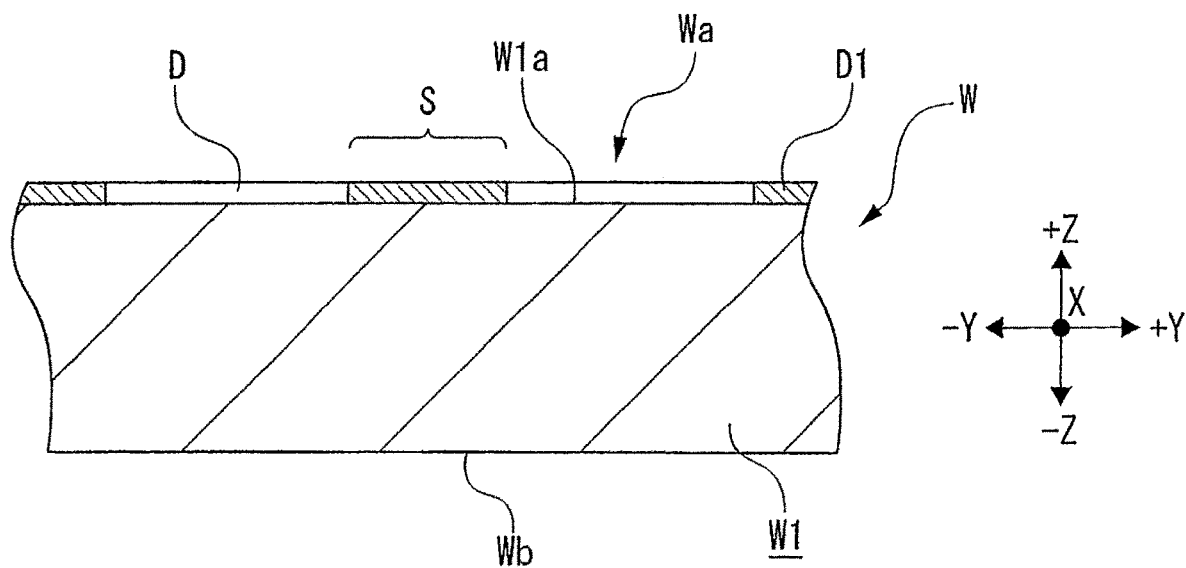
FIG. 2 is a fragmentary cross-sectional view depicting an example of the wafer.

The wafer W depicted in FIGS. 1 and 2 is a circular semiconductor wafer including a substrate W1 made, for example, from silicon. As depicted in FIG. 2, a device layer D1 is stacked over a front side W1a of the substrate W1, and a plurality of devices D is formed in a matrix pattern in the device layer D1. The device layer D1 is configured of a circuit layer formed from a metal, and an insulating layer (for example, a low-k layer) insulating between circuits. The individual devices D are divided by a plurality of streets S set on the front side W1a of the substrate W1 so that the streets S intersect one another at right angles. A back side Wb of the wafer W (a back side of the substrate W1), the back side Wb being a side opposite to the front side Wa of the wafer W, the front side Wa being in turn a front side of the device layer D1, may be protected, for example, by an undepicted protection tape bonded thereto.

For example, at least one TEG, which is not depicted and is configured with a predetermined metal, may be formed on at least one of the streets S. Further, undepicted guard rings may be arranged along outer peripheral edges of the devices D, respectively. The guard rings are regions, each of which is configured of a metal and has a width of several micrometers or so, and serve to prevent chipping or cracks from reaching the devices D upon rupture or the like of the device layer D1. The substrate W1 may also be configured, in addition to silicon, with gallium arsenide, sapphire, gallium nitride, silicon carbide or the like.

(1) Guide Groove Forming Step

In this embodiment, guide grooves are first formed in the device layer D along the streets S from the front side Wa of the wafer W, for example, by a laser beam without allowing the guide grooves to reach the substrate W1.

Figure 3:
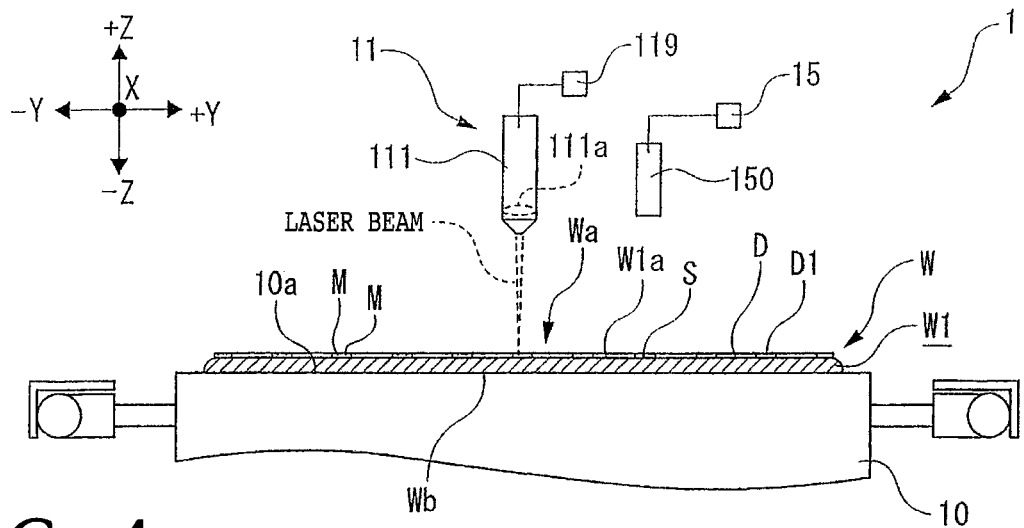
FIG. 3 is a cross-sectional view illustrating a state in which guide grooves are formed along streets from a front side of the wafer by irradiating a laser beam without allowing the guide grooves to reach a substrate.

For example, the wafer W is carried to a laser processing apparatus 1 illustrated in FIG. 3. The laser processing apparatus 1 includes at least a chuck table 10 configured to hold the wafer W under suction, and laser beam irradiation means 11 configured to enable irradiation of a laser beam of a wavelength having absorption in the device layer D1 of the wafer W held on the chuck table 10.

The chuck table 10 is rotatable about an axis that extends in a direction of a Z-axis, and moreover is reciprocatable in a direction of an X-axis as a processing feed direction and in a direction of a Y-axis as an indexing feed direction, the Y-axis intersecting the X-axis at right angles, by unillustrated moving means. The chuck table 10 includes a flat holding surface 10a, which has, for example, a circular shape as its outer shape, is formed of a porous member, and sucks the wafer W. Under a suction force generated by an unillustrated suction source, which communicates to the holding surface 10a, and transmitted to the holding surface 10a, the chuck table 10 can hold the wafer W on the holding surface 10a under suction.

The laser beam irradiation means 11 allows the laser beam, which has been emitted from the laser oscillator 119, to enter a condenser lens 111a inside a condenser 111 via a transmission optical system, whereby the laser beam can be precisely focused and irradiated onto the device layer D1 of the wafer W held on the chuck table 10. The height position of a focal point of the laser beam is configured to be adjustable in a direction of a Z-axis by unillustrated focal point position adjusting means.

The laser processing apparatus 1 includes unillustrated control means configured to perform control of the entire apparatus. By the control means configured of a central processing unit (CPU) and storage devices such as memories, moving operations of the chuck table 10 in the directions of the X-axis and Y-axis, the average output of the laser beam to be irradiated from the laser beam irradiation means 11, and the like are controlled.

In the laser processing apparatus 1, the wafer W is held on the holding surface 10a of the chuck table 10 under suction with the front side Wa directed upward. The positions of the streets S, which are to serve as references for irradiating the laser beam onto the device layer D1, are then detected by alignment means 15 illustrated in FIG. 3. Described specifically, an image of the streets S on the front side Wa of the wafer W is captured by image pickup means 150 such as, for example, a camera, and on the basis of the captured image so formed, the alignment means 15 performs image processing such as pattern matching and detects the coordinate positions of the streets S on the wafer W.

Concomitantly with an input of the detection results of the positions of the streets S to the unillustrated control means, the control means controls the moving direction and moving amount of the chuck table 10. Described specifically, the chuck table 10 is indexed and fed in the direction of the Y-axis to perform an alignment in the direction of the Y-axis between desired one of the streets S, onto which the laser beam is to be irradiated, and the condenser 111. This alignment is performed, for example, so that the center line of the desired one street S is located right below the focal point of the condenser 111.

After the performance of the alignment, the chuck table 10 is further moved to a position slightly offset in the direction of the Y-axis, whereby the position right below the focal point of the condenser 111 slightly deviates from the position of the center line of the desired one street S to a position that is apart from the center line by the distance of the offset in the direction of the Y-axis.

Figure 4:
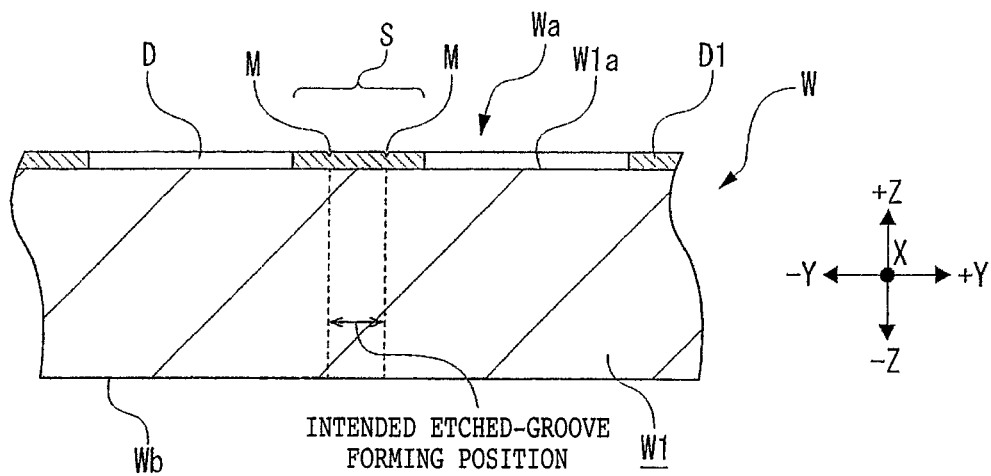
FIG. 4 is a fragmentary cross-sectional view depicting, on an enlarged scale, the guide grooves formed in the wafer without reaching the substrate.

The distance of the offset has been preset in view of the value of the width of each street S or the like, and has been stored beforehand in the unillustrated control means. By setting the distance of the offset while further considering, in addition to information on the width of each street S, information (theoretical values and experimental values) on distances between individual masks to be formed in a below-described mask forming step and information (theoretical values and experimental values) on widths of etched grooves to be formed in a below-described plasma etching step, two guide grooves M (see FIG. 4) can be formed on the device layer D1 without any substantial deviation from an intended position for the formation of an etched groove indicated by two broken lines.

Further, the height position of the focal point of a laser beam to be focused by the condenser lens 111a is aligned, for example, slightly lower than the height position of an upper surface of the device layer D1. The laser oscillator 119 then emits a laser beam of a wavelength having absorption in the device layer D1 so that the laser beam is focused and irradiated onto the device layer D1. The average output of the laser beam is set, for example, low to prevent the resulting guide groove from reaching the substrate W1.

In addition, the wafer W is fed at a predetermined processing feed rate in a direction of −X (to a side below the plane of the drawing sheet), that is, in a direction out of the drawing sheet. The laser beam is progressively irradiated onto the device layer D1 along the street S, whereby the device layer D1 is subjected to abrasion and a guide groove M is formed in the device layer D1 along the street S without reaching the substrate W1.

When the wafer W has advanced in the direction of −X to a predetermined position where the irradiation of the laser beam along the street S is to be ended, the irradiation of the laser beam is stopped. Further, the chuck table 10 is moved in the direction of the Y-axis toward the center line of the street S, for example, by a distance twice as much as the distance of the offset. As a consequence, the position right below the focal point of the condenser 111 is located at a position symmetrical to the position of the guide groove M formed before in the direction of the Y-axis while using the center line of the street S as a reference, in other words, at a position apart from the center line of the street S by the distance of the offset in the direction of the Y-axis.

The wafer W is fed for processing in a direction of +X (to a side above the plane of the drawing sheet), that is, in a direction into the drawing sheet. Similar to the irradiation of the laser beam in the direction out of the drawing sheet, the device layer D1 is subjected to abrasion and another guide groove M is formed in the device layer D1 along the street S without reaching the substrate W1. In this embodiment, the two guide grooves M are formed for the single street S, symmetrically with the center line of the street S interposed therebetween, in the device layer D1. After similar laser beam irradiation has been performed sequentially along all streets S extending in a first direction, the chuck table 10 is rotated 90 degrees and a similar laser beam irradiation is performed along streets S extending in a second direction that intersects the first direction at right angles. Therefore, two guide grooves M are formed corresponding to each of the streets S extending in the second direction on the front side W1 of the substrate W1 symmetrically with the center line of the corresponding street S interposed therebetween, in the device layer D1.

The average output of the laser beam is set low, and the guide grooves M are formed without reaching the substrate W1 Therefore, no reduction or the like occurs in the flexural strength of device chips to be eventually formed by this processing method.

The guide groove forming step may preferably form two guide grooves M corresponding to each street S in the device layer D1 as in this embodiment. As an alternative example, however, a single guide groove M may be formed corresponding to each street S, which extends on the center line of the street S, in the device layer D1.

In this embodiment, two guide grooves M are formed corresponding to each street S in the device layer D1 by processing feeding of the chuck table 10 in the direction out of the drawing sheet and the direction into the drawing sheet. Two guide grooves M may, however, be formed at the same time corresponding to each street S in the device layer D1 by processing feeding of the chuck table 10 in the direction out of the drawing sheet (or in the direction into the drawing sheet). For example, a laser beam emitted from the laser oscillator 119 is allowed to enter the condenser lens 111a after its splitting into two beam paths by splitting means configured of a half-wave plate, a polarizing beam splitter, a mirror and the like. The laser beams entered along the two beam paths are then focused and irradiated onto the device layer D1.

The guide groove forming step may also be performed using a cutting apparatus instead of irradiation of a laser beam as in this embodiment. In this case, two guide grooves are formed without reaching the substrate W1 by causing a rotating, ultra thin cutting blade to cut into the device layer D1 along the corresponding street S from the front side Wa of the wafer W.

(2) Tape Bonding Step

Figure 5:
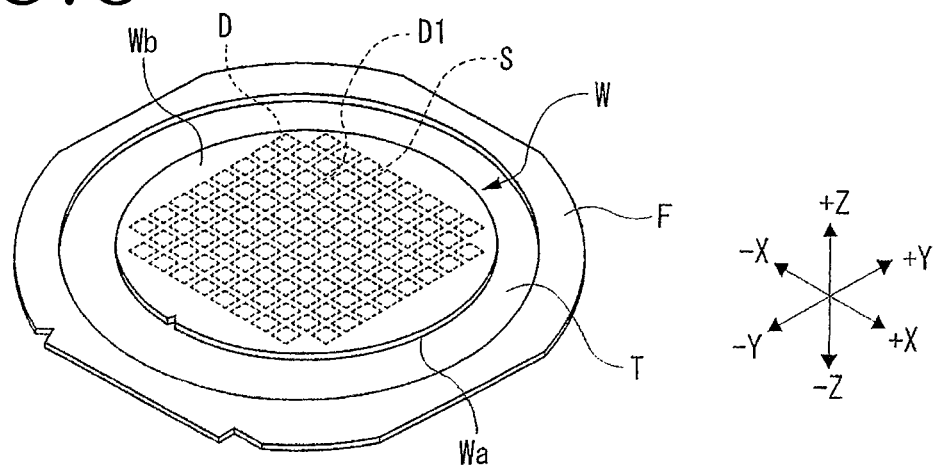
FIG. 5 is a perspective view illustrating the wafer supported by an annular frame with a tape bonded to the front side of the wafer.

To the front side Wa of the wafer W with the guide grooves M formed therein, a tape T is bonded, for example, as illustrated in FIG. 5. The tape T is a circular tape having a larger diameter than the wafer W, and is formed of a base material Td, which is made, for example, of a polyolefin resin or the like, and a glue layer Tc on the base material Td (see FIG. 6). As the glue layer Tc, it is preferred to use an ultraviolet (UV)-curable glue that is cured by ultraviolet irradiation to have a reduced adhesive force.

For example, an annular frame F is positioned relative to the wafer W so that the center of the wafer W mounted on an unillustrated bonding table and the center of an opening of the annular frame F substantially align with each other. The glue layer Tc of the tape T is pressed against and bonded to the front side Wa of the wafer W by a press roller or the like on the bonding table. By also bonding the glue layer Tc at an outer circumferential part thereof to the annular frame F at the same time, the wafer W is supported on the annular frame F via the tape T so that the wafer W can be handled via the annular frame F. As an alternative, the tape T may be bonded to the annular frame F by appropriately positioning the wafer W relative to the annular frame F after first bonding the tape T to the wafer W alone by a press roller or the like.

As the annular frame F and tape T, it is preferred, for example, to use those having durability to etching gas (for example, $SF_6$ gas or $C_4F_8$ gas) to be used in the subsequent plasma etching step. As specific examples, the annular frame F may preferably be formed of stainless steel, and the tape T may preferably be formed of a polyolefin or the like.

(3-1) Formation of Water-Soluble Resin Layer in Mask Forming Step

A mask, which is to be used for the formation of etched grooves in the substrate W1 along the streets S from the back side Wb of the wafer W, is then formed on the back side Wb. In this embodiment, a water-soluble resin layer is first formed on the back side Wb of the wafer W.

Figure 6:
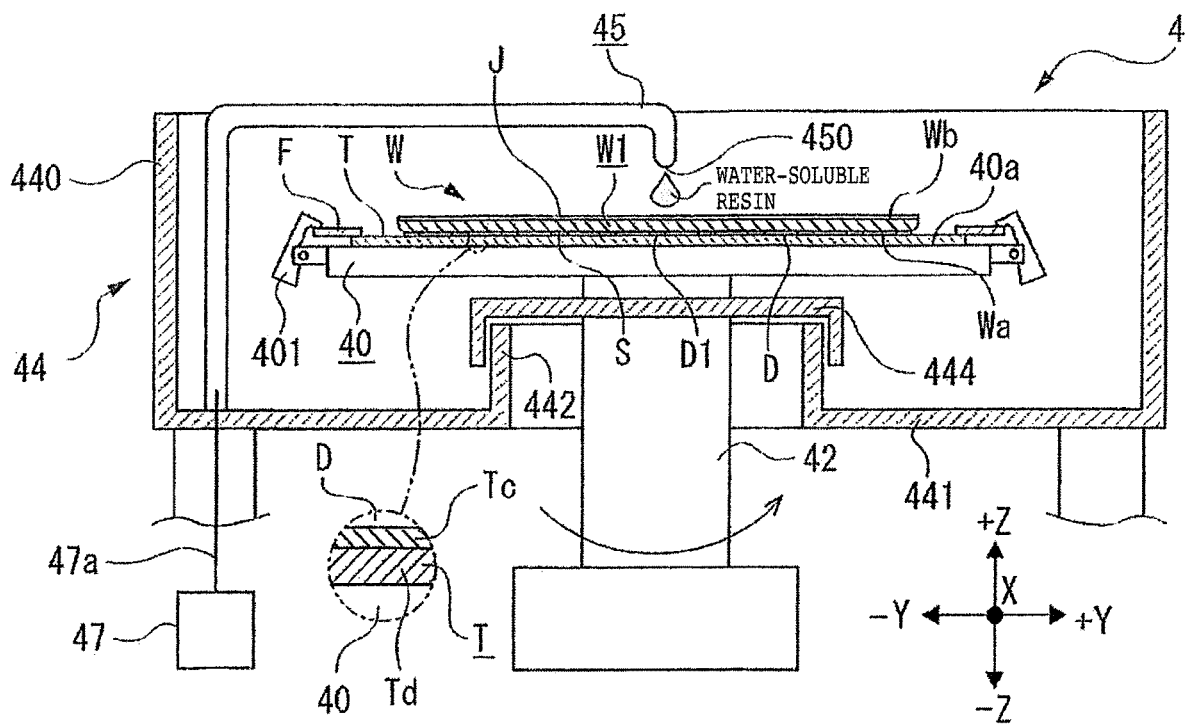
FIG. 6 is a cross-sectional view illustrating a state in which a water-soluble resin layer is formed on a back side of the wafer by using a spin coater.

The wafer W, which has now become ready for handling via the annular frame F, is transferred, for example, to a spin coater 4 depicted in FIG. 6. The spin coater 4 includes, for example, a holding table 40 configured to hold the wafer W, rotating means 42 configured to rotate the holding table 40, and a bottomed cylindrical casing 44 having an opening on an upper end side thereof and accommodating the holding table 40 therein.

The holding table 40 has, for example, a circular shape as its outer shape, is formed of a porous member or the like, and includes a holding surface 40a communicating to an unillustrated suction source. On a circumference of the holding table 40, fixing clamps 401 are evenly disposed at predetermined intervals in a circumferential direction to fix the annular frame F. Upon mounting the wafer W, the holding table 40 is lifted and positioned at a loading/unloading height position. Upon coating the suction-held wafer W with the water-soluble resin in a liquid form, the holding table 40 is lowered to a coating height position in the casing 44. The holding table 40 is also configured to be rotatable by the rotating means 42, which is disposed below, about an axis that extends in a direction of a Z-axis.

The casing 44 is configured from an outer side wall 440 surrounding the holding table 40, a bottom plate 441 connected to a lower part of the outer side wall 440 and centrally defining an opening in which a rotating shaft of the rotating means 42 is inserted, and an inner side wall 442 arranged upright from an inner circumferential edge of the opening of the bottom plate 441. A cover 444 is fitted on the rotating shaft, and is disposed between a lower surface of the holding table 40 and an upper end surface of the inner side wall 442 of the casing 44 to prevent intrusion of foreign matter into a clearance between the rotating shaft and the opening of the bottom plate 441.

In the casing 44, a nozzle 45 is disposed to drop the water-soluble resin in the liquid form onto the wafer W held on the holding surface 40a. The nozzle 45 is arranged extending upright from the bottom plate 441, has a substantially L-shaped outer form as seen in a side view, and is turnable about an axis extending in the direction of the Z-axis. A supply orifice 450, which is formed through a tip portion of the nozzle 45, opens toward the holding surface 40a of the holding table 40.

The nozzle 45 communicates to a water-soluble resin supply source 47, in which the water-soluble resin is stored in the liquid form, via a piping 47a and an unillustrated rotary joint. The water-soluble resin stored in the water-soluble resin supply source 47 is, for example, polyvinylpyrrolidone (PVP), polyvinyl alcohol (PVA) or the like, and is specifically HogoMax manufactured by DISCO corporation.

The wafer W is mounted on the holding surface 40a of the holding table 40 via the tape T, and is held under suction by the holding table 40. Further, the annular frame F is fixed by the individual fixing clamps 401. The holding table 40 with the wafer W held thereon is then lowered to the coating height position in the casing 44. The nozzle 45 is then turned to position the supply orifice 450 centrally above the back side Wb of the wafer W.

Figure 7:
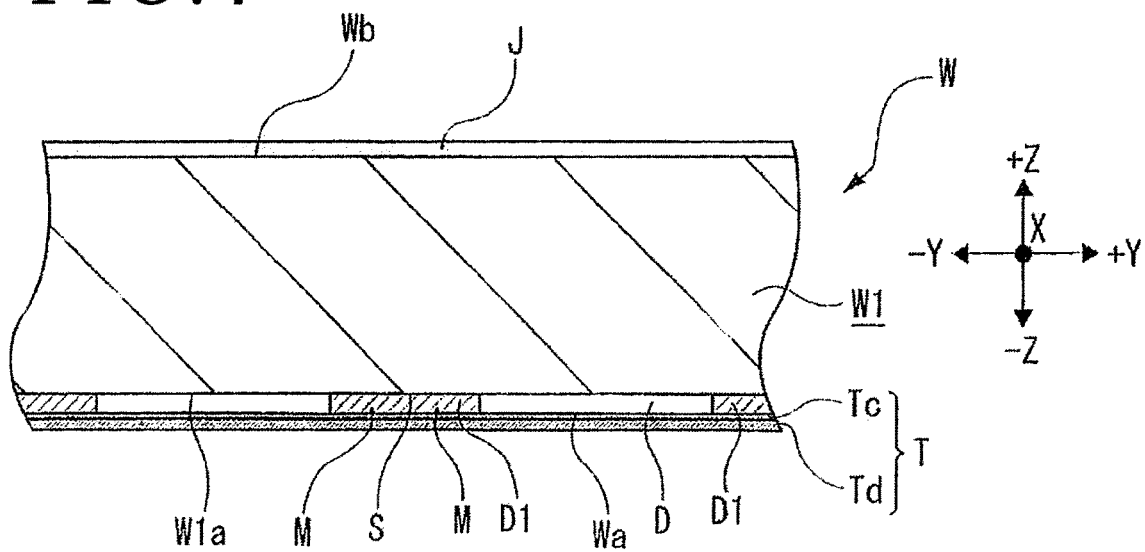
FIG. 7 is a cross-sectional view depicting, on an enlarged scale, a portion of the wafer with the water-soluble resin layer formed on the back side of the wafer.

The water-soluble resin supply source 47 next supplies the water-soluble resin to the nozzle 45, and the water-soluble resin is dropped in a predetermined amount onto the back side Wb of the wafer W. The holding table 40 is rotated at a low speed, whereby the dropped water-soluble resin flows from the center of the back side Wb toward its outer circumference under a centrifugal force and spreads over the entire surface of the back side Wb. As a consequence, a water-soluble resin layer J is formed with a substantially uniform thickness as illustrated in FIGS. 6 and 7. Subsequently, the rotation is continued to spin-dry the water-soluble resin layer J. However, the drying of the water-soluble resin layer J may also be performed by heating the water-soluble resin layer J with a heater or xenon flash lamps disposed above the holding table 40.

(3-2) Formation of Mask in Mask Forming Step

Figure 8:
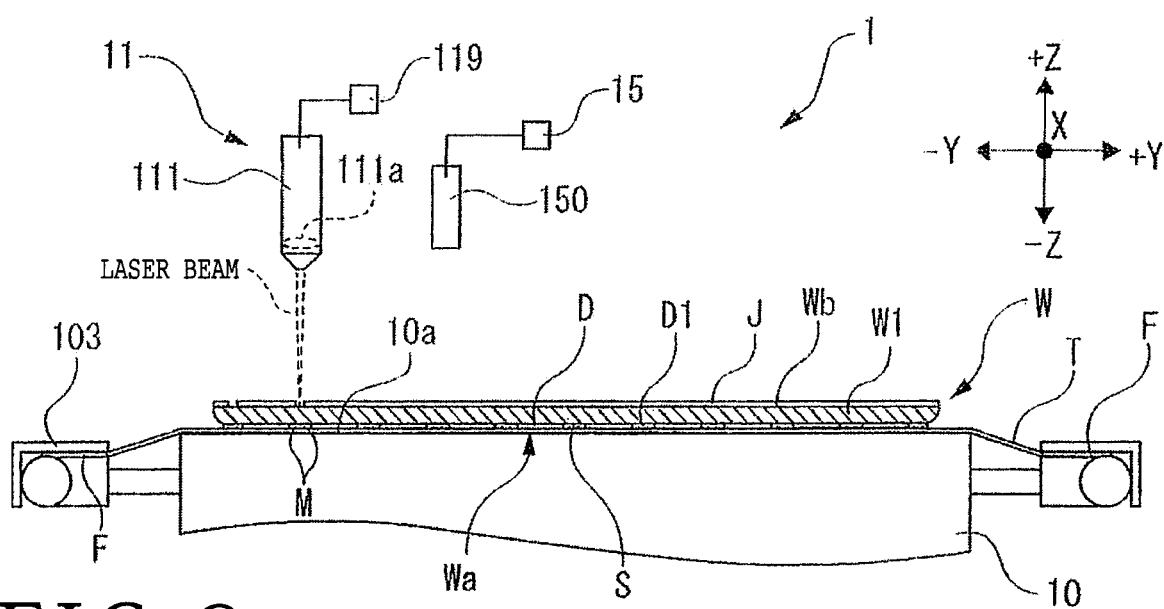
FIG. 8 is a cross-sectional view illustrating a state in which a mask is formed on the back side of the wafer by irradiating a laser beam along the streets onto the water-soluble resin layer on the wafer and removing the water-soluble resin layer.

The wafer W with the water-soluble resin layer J formed thereon is transferred to the laser processing apparatus 1 depicted in FIG. 8, and is held on the holding surface 10a of the chuck table 10 under suction via the tape T. The laser processing apparatus 1 includes, on a circumference of the chuck table 10, fixing clamps 103 evenly at predetermined intervals in a circumferential direction to fix the annular frame F, and therefore the annular frame F is clamped and fixed by the fixing clamps 103.

The position of desired one of the streets S, the desired street S being to serve as a reference for irradiating the laser beam onto the wafer W, is then detected by the alignment means 15. Described specifically, an image of the streets S on the front side Wa is captured, for example, by the image pickup means 150 (for example, an infrared camera) by causing light, for example, an infrared ray to transmit from the back side Wb of the wafer W, and on the basis of the captured image so formed, the alignment means 15 performs image processing such as pattern matching so that a coordinate position of the desired one street S on the wafer W are detected.

Concomitantly with the detection of the desired one street S, the chuck table 10 is moved in the direction of the Y-axis under control by the unillustrated control means to perform an alignment between the street S and the condenser 111 of the laser beam irradiation means 11. The position of a focal point of a laser beam to be focused by the condenser lens 111a is then aligned with the height position of the water-soluble resin layer J. The laser oscillator 119 oscillates a laser beam of a wavelength having absorption in the water-soluble resin layer J, and the laser beam is focused and irradiated onto the water-soluble resin layer J. In addition, the wafer W is fed at a predetermined processing feed rate in the direction of −X (to the side below the plane of the drawing sheet), that is, in the direction out of the drawing sheet, and therefore the laser beam is progressively irradiated onto the water-soluble resin layer J along the street S, whereby the water-soluble resin layer J is removed through fusion and evaporation and the back side Wb of the substrate W1 is exposed corresponding to the street S.

Figure 9:
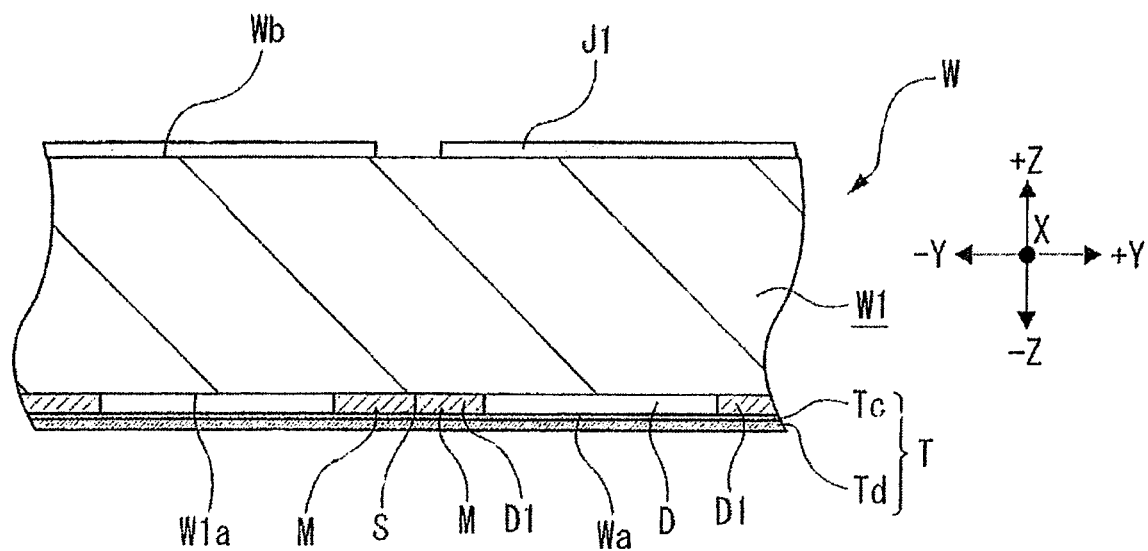
FIG. 9 is a cross-sectional view illustrating, on an enlarged scale, a portion of the wafer with the mask formed on the back side thereof.

When the wafer W has advanced in the direction of −X to a predetermined position where the irradiation of the laser beam along the street S is to be ended, the irradiation of the laser beam is stopped, and at the same time the chuck table 10 is moved in the direction of the Y-axis to perform an alignment in the direction of the Y-axis between the street S, which is adjacent to the street S served as the reference in the processing feed in the direction of −X, and the condenser 111. The wafer W is then fed for processing in the direction of +X (to the side above the plane of the drawing sheet), that is, in the direction into the drawing sheet. Similar to the irradiation of the laser beam in the direction out of the drawing sheet, the water-soluble resin layer J is removed and the back side Wb of the substrate W1 is exposed corresponding to the street S. After similar laser beam irradiation has been performed sequentially along all the streets S extending in the direction of the X-axis, the chuck table 10 is rotated 90 degrees and a similar laser beam irradiation is performed. As a consequence, a mask J1 depicted in FIG. 9 is formed on the back side Wb of the substrate W1 at regions other than those corresponding to the streets S.

The mask forming step is, however, not limited to the above-described example. For example, the mask J1 may also be formed with a resist instead of the water-soluble resin. Further, a mask may also be formed by bonding a die attach film (DAF), which is in the form of a circular sheet having a diameter substantially equal to or greater than the wafer W, to the back side Wb of the wafer W and then irradiating the laser beam onto the DAF along the streets S from the back side Wb to expose the substrate W1 corresponding to the streets S. Using liquid DAF instead of the sheet-shaped DAF, a mask of DAF may be formed in substantially similar procedures as the formation of the mask J1 of the water-soluble resin. As a still further alternative example, a mask may also be formed by photolithography on the back side Wb of the wafer W.

(46) Plasma Etching Step

Figure 10:
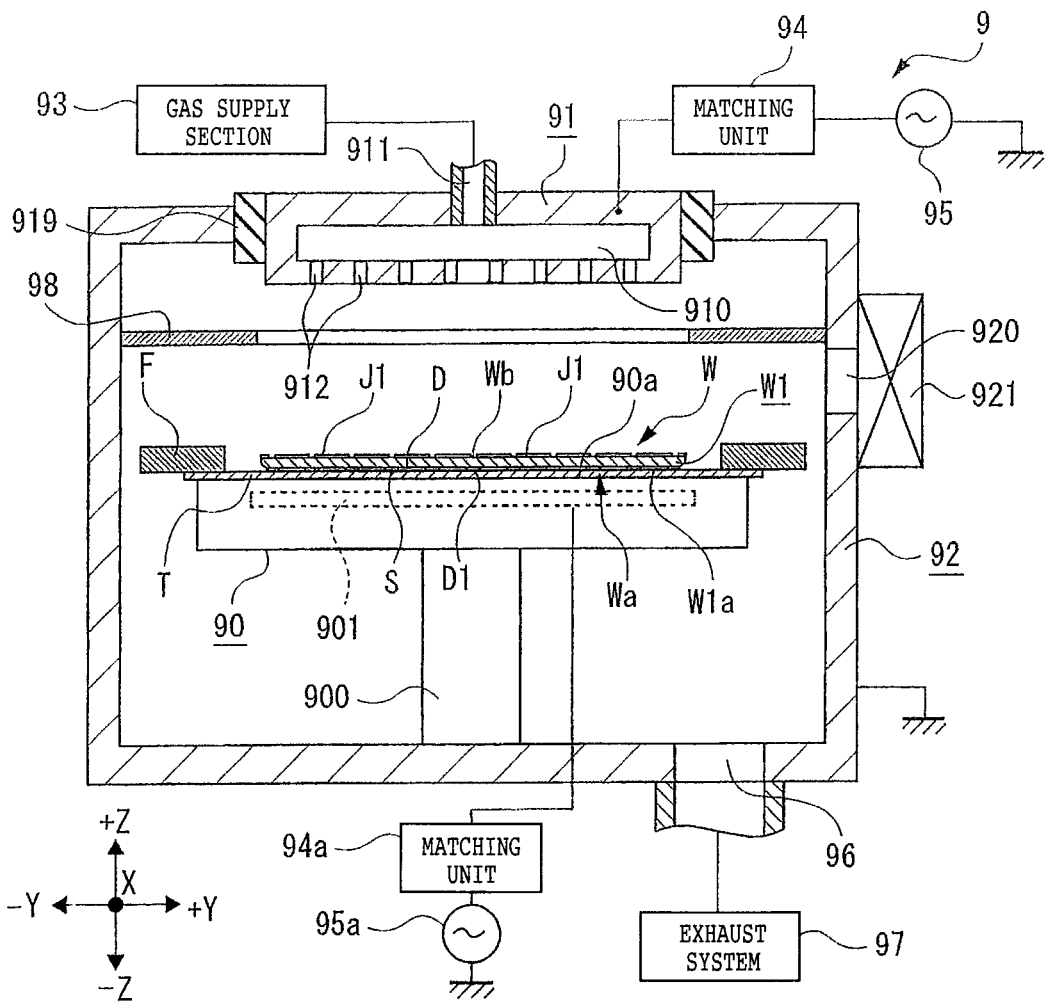
FIG. 10 is a cross-sectional view depicting an example of a plasma etching apparatus that applies plasma etching to the wafer.

After the formation of the mask J1, etched grooves are formed along the streets S by applying plasma etching to the substrate W1 of the wafer W through the mask J1, for example, with a plasma etching apparatus 9 illustrated in FIG. 10.

The plasma etching apparatus 9 illustrated in FIG. 10 includes holding means 90 configured to hold the wafer W, a gas blow head 91 configured to blow gas, and a chamber 92 with the holding means 90 and gas blow head 91 internally accommodated therein. The plasma etching apparatus may also be an inductively coupled plasma etching apparatus that applies plasma-generating high-frequency power to an induction coil to activate etching gas into a plasma through interaction with a magnetic field produced by the induction coil.

For example, the holding means 90 is an electrostatic chuck, is formed of a dielectric such as a ceramic, and is supported from below by a support member 900. Inside the holding means 90, a disk-shaped electrode 901, which generates electric charges upon application of a voltage, is disposed in parallel to a holding surface 90a of the holding means 90, and the electrode 901 is connected to a matching device 94a and a bias high-frequency power supply 95a.

Inside the holding means 90, for example, an unillustrated water flow channel is formed. With cooling water circulating through the water flow channel, the holding means 90 is internally cooled to a predetermined temperature. Heat transfer gas such as He gas is configured to flow at a predetermined pressure between the holding surface 90a and the wafer W held on the holding surface 90a so that the efficiency of heat absorption by the cooling water from the wafer W can be improved. The holding means 90, for example, is not limited to the single-electrode electrostatic chuck exemplified in the figure, but may also be a dual-electrode electrostatic chuck.

Inside the gas blow head 91 disposed movably up and down via a bearing 919 in an upper part of the chamber 92, a gas diffusion space 910 is arranged. A gas inlet port 911 communicates to an upper part of the gas diffusion space 910, and a plurality of gas delivery holes 912 communicates to a lower part of the gas diffusion space 910. The individual gas delivery holes 912 open at lower ends thereof toward the holding surface 90a of the holding means 90. In a gas supply section 93 connected to the gas inlet port 911, fluorine-based gas such as, for example, $SF_6$, $CF_4$, $C_2F_6$ or $C_4F_8$ is stored as etching gas.

To the gas blow head 91, a high-frequency power supply 95 is connected via a matching device 94. High-frequency power is supplied from the high-frequency power supply 95 to the gas blow head 91 via the matching device 94, whereby the etching gas delivered from the gas delivery holes 912 can be activated into a plasma.

The plasma etching apparatus 9 includes an unillustrated control section, and conditions such as the delivery rate and time of the gas and the high-frequency power are controlled by the control section.

An exhaust port 96 is formed through a bottom of the chamber 92, and an exhaust system 97 is connected to the exhaust port 96. By actuating the exhaust system 97, the interior of the chamber 92 can be depressurized into a vacuum atmosphere. Further, the chamber 92 is provided at a side wall thereof with a loading/unloading port 920 and a gate valve 921 configured to open and close the loading/unloading port 920.

Inside the chamber 92, an anti-overheating frame guard 98 is disposed to prevent overheating of the annular frame F during plasma etching. The anti-overheating frame guard 98 is, for example, one obtained by forming stainless steel (SUS) or the like, which has durability to etching gas, into an annular plate, and is disposed on an inner side wall of the chamber 92 so that the anti-overheating frame guard 98 extends inward in a radial direction.

The formation of the etched grooves in the substrate W1 in this embodiment may preferably be performed, for example, by a Bosch process that alternately repeats plasma etching with $SF_6$ gas and deposition of a protective film on side walls or the like of grooves with $C_4F_8$ gas. As an alternative, the etched grooves may also be formed in the substrate W1 by plasma etching with $SF_6$ gas alone.

In this step, the wafer W is first loaded into the chamber 92 from the loading/unloading port 920, and is mounted on the holding surface 90a of the holding means 90 with the side of the mask J1 directed upward. The gate valve 921 is then closed, and the interior of the chamber 92 is brought into a vacuum atmosphere by the exhaust system 97. The annular frame F from which the wafer W is supported is upwardly covered by the anti-overheating frame guard 98.

The gas blow head 91 is lowered to a predetermined height position. $SF_6$ gas is supplied from the gas supply section 93 into the gas diffusion space 910, and is blown downward from the gas delivery holes 912. In addition, high-frequency power is applied from the high-frequency power supply 95 to the gas blow head 91, and a high-frequency electric field is generated between the gas blow head 91 and the holding means 90 to activate the $SF_6$ gas into a plasma. In parallel with this, a voltage is applied from the bias high-frequency power supply 95a to the electrode 901 to allow the dielectric polarization phenomenon to occur between the holding surface 90a of the holding means 90 and the wafer W, whereby the wafer W is attracted and held on the holding surface 90a via the tape T by an electrostatic attraction force produced by polarization of electric charges.

The $SF_6$ gas, which has been activated into the plasma, progressively performs isotropic etching of the substrate W1 in its regions corresponding to the streets S without any substantial etching of the back side Wb of the wafer W at the regions where the mask J1 is formed. Thermal effects of the $SF_6$ gas, which has been activated into the plasma, on the annular frame F are suppressed by the anti-overheating frame guard 98 that covers upwardly of the annular frame F.

Figure 11:
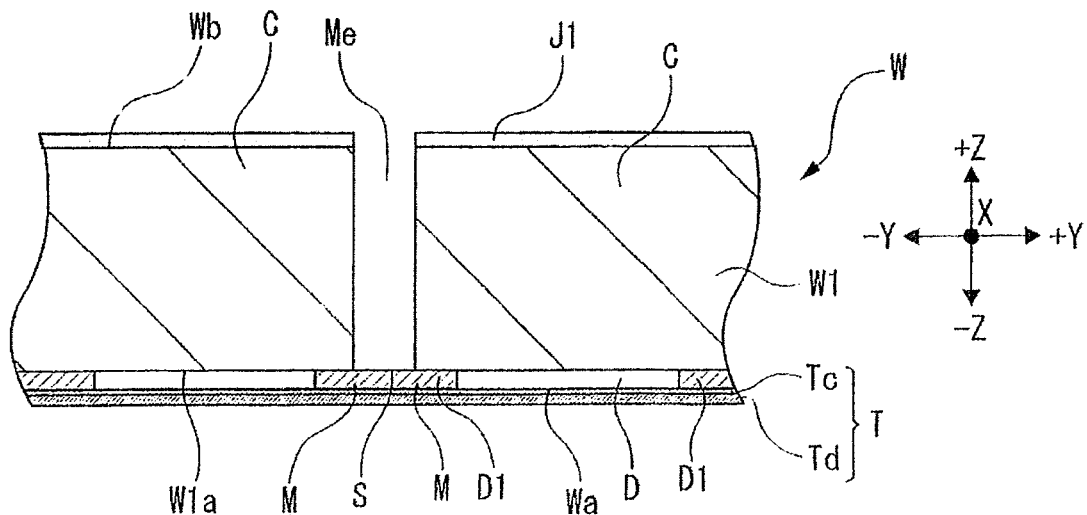
FIG. 11 is a cross-sectional view depicting a portion of the wafer to which plasma etching has been applied.

Next, the $C_4F_8$ gas is supplied from the gas supply section 93 into the gas diffusion space 910, and is blown downward from the gas delivery holes 912. The high-frequency power is applied from the high-frequency power supply 95 to the gas blow head 91, and in addition the high-frequency power is applied from the bias high-frequency power supply 95a to the electrode 901 to activate the $C_4F_8$ gas into a plasma, whereby fluorocarbon films are allowed to deposit as protective films on the side walls and bottoms of the etched grooves formed by isotropic etching. Again, $SF_3$ gas is supplied into the chamber 92 and is activated into a plasma to perform anisotropic etching so that only the protective films on the bottoms of the etched grooves are removed. Then, isotropic etching of the substrate W1 exposed in the bottoms of the etched grooves is performed again. Taking the above-described isotropic etching, protective film deposition and anisotropic etching as a single cycle, this cycle is performed, for example, several tens of times, whereby vertical deep etching of the substrate W1 is realized at a high speed with a desired aspect ratio to form grid-patterned etched grooves Me in the substrate W1 along the streets S as depicted in FIG. 11.

Fluorine-based etching gas does not etch the device layer D1 formed from a metal or the like. The plasma etching is, therefore, ended after performing it until the upper surface of the device layer D1 is exposed in the bottom of each etched groove Me without the bottom of the etched groove Me reaching the device layer D1. Described specifically, the introduction of the etching gas or the like into the chamber 92 and the supply of the high-frequency power to the gas blow head 91 are stopped, and the etching gas in the chamber 92 is exhausted to the exhaust system 97, thereby creating, inside the chamber 92, a state that no etching gas exists. As a consequence, as depicted in FIG. 11, the etched grooves Me (fully cut grooves) are formed in the substrate W1 along the streets S, and the regions C surrounded by the etched grooves Me are defined in the substrate W1.

As an alternative, plasma etching may be performed until the wafer W is brought into a state that the substrate W1 remains as an etch leftover with a small thickness in the bottom of each etched groove Me. In this case, the etch leftover may preferably have a thickness of 10 μm or smaller.

According to the Bosch process, the aspect ratio of each etched groove Me can be controlled by changing parameters when causing $SF_6$ gas and $C_4F_8$ gas to alternately flow into the chamber 92. Each etched groove Me can, therefore, be formed so that the positions of its opposite walls substantially align with the respective positions of the corresponding two guide grooves M.

As described above, in the wafer processing method according to the present invention, plasma etching is applied through the mask J1 from the back side Wb of the wafer W rather than the front side Wa of the wafer W to form a plurality of the etched grooves Me in the substrate W1 along the streets S, thereby avoiding the occurrence of a situation such that during the etching, the front side Wa of the wafer W is exposed at areas where the mask is thin, and the corresponding devices D are damaged.

If the mask J1 is not one formed from a water-soluble resin (for example, is a resist film), the mask J1 may be removed from the substrate W1 through ashing or the like by the plasma etching apparatus 9 before or after a water immersion step to be performed next.

(5) Water Immersion Step

Figure 12:
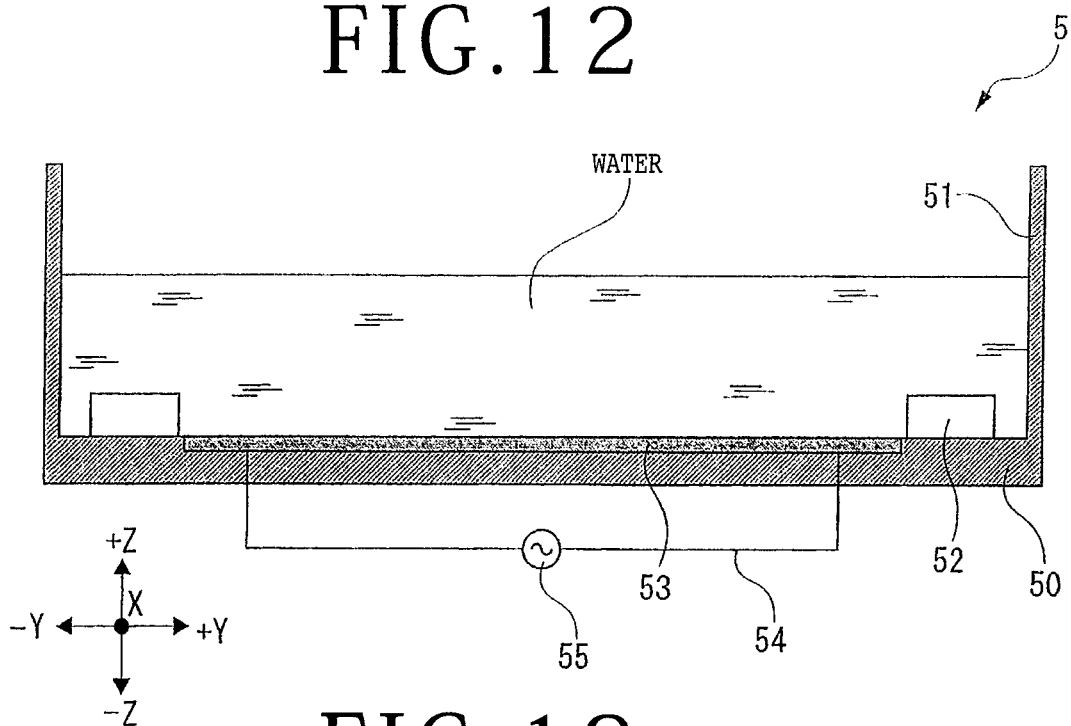
FIG. 12 is a cross-sectional view depicting an example of a water bath including an ultrasonic vibrator.

The wafer W with the etched grooves Me formed therein as depicted in FIG. 11 is next transferred into a bottomed cylindrical water bath 5 depicted in FIG. 12. The water bath 5 enables immersion of the wafer W, which is supported by the annular frame F, in its entirety, is configured of a side wall 51 and a bottom plate 50 integrally connected to a lower part of the side wall 51, and stores water (for example, pure water) therein. On an upper surface of the bottom plate 50, an ultrasonic vibrator 53 is disposed. The ultrasonic vibrator 53 is formed, for example, in a disk shape by a plurality of piezoelectric elements arranged side by side. To the ultrasonic vibrator 53, unillustrated terminals are connected. A high-frequency power supply 55 is connected to the ultrasonic vibrator 53 via the terminals and wires 54 to apply an alternate current voltage across the ultrasonic vibrator 53. The shape, the disposed location and the like of the ultrasonic vibrator 53 are not limited to this embodiment.

At an area of the upper surface of the bottom plate 50, the area being on a side outer than an area where the ultrasonic vibrator 53 is disposed, for example, frame rests 52 are disposed evenly at predetermined intervals in a circumferential direction to mount the annular frame F thereon. As an alternative, the frame rests 52 may be integrally formed in an annular shape, or may be provided with clamps to clamp and fix the annular frame F.

The water bath 5 may preferably be configured including the frame rests 52 as in this embodiment, but the water bath 5 may be configured without including the frame rests 52. Described specifically, the annular frame F is thicker than the wafer W so that the annular frame F, which has been transferred into the water bath 5 and supports the wafer W thereon, may be directly mounted on the bottom plate 50. It is, however, not preferred if the wafer W sags in the water bath 5 and comes into contact with the ultrasonic vibrator 53. It is, hence, preferred as in this embodiment to arrange the frame rests 52 to form a certain degree of clearance between the wafer W and the ultrasonic vibrator 53.

Figure 13:
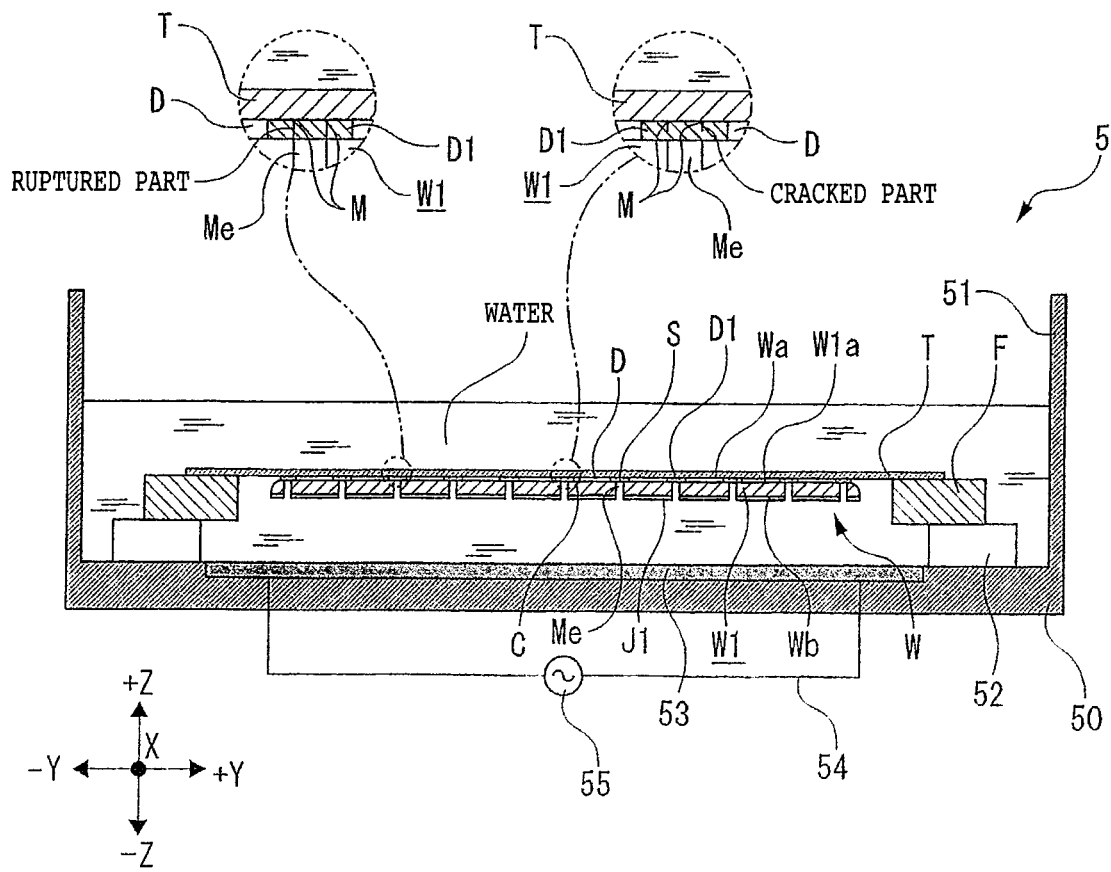
FIG. 13 is a cross-sectional view illustrating a state in which the wafer is immersed in water, to which ultrasonic vibrations are being applied by the ultrasonic vibrator, and cracks are formed in the device layer along outer peripheral edges of chip regions or the device layer is ruptured along the outer peripheral edges of the chip regions.

In the water immersion step in this embodiment, as illustrated in FIG. 13, for example, the wafer W is immersed in a direction such that the ultrasonic vibrator 53 and the back side Wb of the wafer W face each other and the annular frame F is mounted on upper surfaces of the frame rests 52.

If the ultrasonic vibrator 53 is disposed at a height above the wafer W immersed in the water bath 5, the wafer W may be immersed in the water bath 5 with the back side Wb directed upward.

High-frequency power is supplied, for example, at an output of 200 W from the high-frequency power supply 55 to the ultrasonic vibrator 53, and the ultrasonic vibrator 53 converts the high-frequency power to mechanical vibrations primarily in an up-and-down direction, whereby the ultrasonic vibrator 53 generates ultrasonic vibrations at a predetermined frequency (for example, 25 kHz). The generated ultrasonic vibrations then propagate to the wafer W via water, the wafer W vibrates to produce a shear stress in a vertical direction in the device layer D1 at locations corresponding to the etched grooves Me, and cracks are formed in the device layer D1 along the outer peripheral edges of the chip regions C or the device layer D1 is ruptured along the outer peripheral edges of the chip regions C. The output of the high-frequency power supply 55 may preferably be 200 to 1,000 W, while the frequency of the ultrasonic vibrations may preferably be 25 to 120 kHz.

In the water immersion step in this embodiment, the wafer W is immersed in the direction such that the ultrasonic vibrator 53 and the back side Wb of the wafer W face each other. Therefore, cracks occur more readily in the device layer D1 of the wafer W along the outer peripheral edges of the chip regions C or the device layer D1 ruptures more readily along the outer peripheral edges of the chip regions C. One of reasons for the availability of such advantageous effects can be attributed to the direct application of shock waves to the device layer D1 when cavitation bubbles generated in water under ultrasonic vibrations rise in the etched grooves Me of the wafer W, come to contact with the device layer D1, and hence collapse there.

Further, the guide groove forming step is first performed to form the guide grooves M in the device layer D1 in this embodiment, so that with the formed guide grooves M serving as starting points, cracks are formed in the device layer D1 or the device layer D1 is ruptured. It is, therefore, possible to avoid damage to the devices D and also to prevent the device layer D1 from having dimensions greater than the substrate W1 of the chips (protruding parts of the device layer D1 from having larger dimensions). Especially in this embodiment, two guide grooves M are formed in the device layer D1 as rupture starting points corresponding to each street S so that the two guide grooves M substantially align with the opposite walls of the corresponding etched groove Me, and therefore protruding parts of the device layer D1 are minimized.

The mask J1 on the chip regions C may be removed, for example, in the water bath 5, or may be cleaned off, for example, in a cleaning apparatus different from the water bath 5. If the mask J1 on the chip regions C is removed in the water bath 5, the mask J1 made from the water-soluble resin is dissolved and removed by ultrasonic cleaning. The water bath 5 is provided, for example, with an unillustrated drainage system and water supply system. Spent water in the water bath 5, in which the mask J1 has dissolved, is drained through the drainage system, and fresh water is additionally supplied from the water supply system into the water bath 5.

(6) Separation of Devices from Tape

Figure 14:
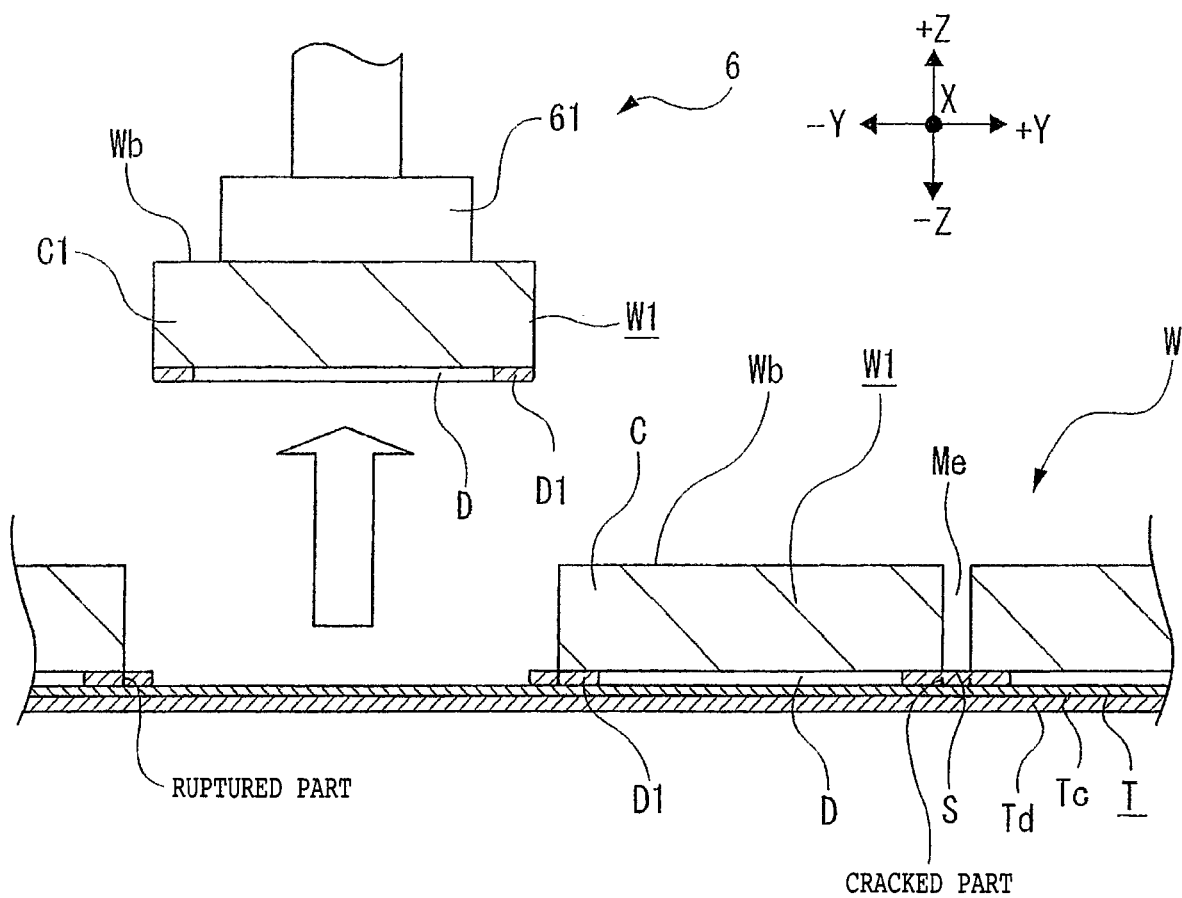
FIG. 14 is a cross-sectional view illustrating a state in which a device is being separated from a tape.

The wafer W, in which cracks have occurred in the device layer D1 along the outer peripheral edges of the chip regions C surrounded by the etched grooves Me or the cracks have occurred along the outer peripheral edges of the chip regions C, is raised from the water bath 5, subjected to natural drying, blow drying, spin drying or the like, and then transferred, for example, to a pickup apparatus 6 illustrated in FIG. 14. If a UV-curable glue is used in the glue layer Tc of the tape T, an ultraviolet ray may be irradiated onto the tape T before performing the separation of the devices D from the tape T in the pickup apparatus 6, whereby the glue layer Tc is cured to have a reduced adhesive force.

In the pickup apparatus 6, the annular frame F is fixed by unillustrated clamps or the like, and each chip region C is picked up with its upper surface, from which the mask J1 has been removed, being held under suction by a suction pad 61. As a consequence, the corresponding device D is separated from the tape T. Here, at parts of the device layer D1 where cracks have occurred along the outer peripheral edges of the chip region C, the device layer D1 is ruptured along the outer peripheral edges of the chip region C by the pick-up. Upon the separation, each device D may be pushed upward from a lower side through the tape T, for example, by an unillustrated needle configured to be movable up and down in the direction of the Z-axis.

As a consequence, a device chip C1 can be formed with the device D and device layer D1 included therein as illustrated in FIG. 14.

If the mask J1 is formed from a DAF, for example, the mask J1 is not removed from each chip region C in the water immersion step, but the DAF on each chip region C is held under suction and picked up by the suction pad 61 so that the corresponding device D is separated from the tape T. As a consequence, it is possible to form the device chip C1 that can be packed or stacked on another substrate via the DAF and has the device D and device layer D1.

The separation of the devices D from the tape T is not limited to pick-up that as described above, forms the device chips C1. For example, the individual devices D may be separated all together from the tape T by bonding a circular tape, which is different from the tape T illustrated in FIG. 14, to the entire back side Wb of the wafer W and transferring the wafer W from the tape T to the different tape.

As has been described above, the wafer processing method according to the present invention can obtain the device chips C1 by separating the devices D from the tape T (for example, by picking up the chip regions C) after the performance of the water immersion step. Further, there is no potential risk that the device chips C1 could be reduced in flexural strength, because no irradiation of a laser beam of high power is performed onto the substrate W1 of the wafer W in any of the steps in the processing method according to the present invention.

The individual steps in the wafer processing method according to the present invention are not limited to the above-described embodiment, and obviously can be performed in various different modes within the scope of the technical concept of the present invention. Concerning elements such as the laser processing apparatus 1 and the plasma etching apparatus 9 depicted or illustrated in the accompanying drawings, they are not limited to such exemplified configurations either and modifications are feasible as needed insofar as the advantageous effects of the present invention can be brought about.

The guide groove forming step can be performed at any stage before the performance of at least the water immersion step and the tape bonding step. However, its performance as a first step in the processing method as in this embodiment is preferred because upon sequentially practicing the subsequent individual steps, the number of upside-down operations of the front side Wa and back side Wb of the wafer W can be decreased.

The guide groove forming step is not an essential step, because depending on the thickness and configuration of the device layer D1, the rupture or the like of the device layer D1 along the etched grooves Me is possible, without the guide grooves formed in the device layer D1, upon the application of ultrasonic vibrations in the water immersion step. Especially if a workpiece is a wafer with unillustrated guard rings arranged along the outer peripheral edges of the devices D or in a like case, the need for practicing the guide groove forming step is lowered further because, although the omission of guide grooves in the device layer D1 may result in incomplete division of the device layer D1 even when ultrasonic vibrations are applied in the water immersion step, the device layer D1 can be completely divided when the chips are individually picked up in the separation of the devices D from the tape T. In this case, the device layer D1 is torn off so that depending on the kind of the device layer D1, the device layer D1 may separate beyond the streets S. However, the arrangement of guard rings along the outer peripheral edges of the devices D prevents separation of the device layer D1 beyond the streets S.

The tape bonding step can be performed at any stage before the performance of the water immersion step. It is, however, preferred to perform the tape bonding step before the performance of the mask forming step and plasma etching step as in this embodiment, because in the mask forming step and plasma etching step, handling of the wafer W can be readily performed via the annular frame F.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A wafer processing method including a substrate and a device layer stacked over a surface of the substrate, the wafer having devices formed in respective regions divided by a plurality of intersecting streets, the method comprising:
   a mask forming step of forming, on a back side of the wafer, a mask to be used in forming a plurality of etched grooves in the substrate along the intersecting streets from the back side of the wafer;
   a plasma etching step of applying plasma etching from the back side of the wafer through the mask after performing the mask forming step, thereby forming the etched grooves in the substrate along the intersecting streets and defining chip regions surrounded by the etched grooves;
   a water immersion step of applying ultrasonic vibrations to the wafer by an ultrasonic vibrator, after performing the plasma etching step, to form cracks in the device layer along outer peripheral edges of the chip regions or rupturing the device layer along the outer peripheral edges of the chip regions; and
   a tape bonding step of bonding a tape to a front side of the wafer before performing at least the water immersion step,
   wherein the devices are separated from the tape after performing the water immersion step.

2. The wafer processing method according to claim 1, further comprising:
   before performing at least the mask forming step, a guide groove forming step of forming guide grooves in the device layer along the intersecting streets from the front side of the wafer by a cutting blade or a laser beam without allowing the guide grooves to reach the substrate.

3. The wafer processing method according to claim 1, wherein in the water immersion step, the wafer is immersed in a direction such that the ultrasonic vibrator and the back side of the wafer face each other.

4. The wafer processing method according to claim 2, wherein the guide groove forming step includes forming two guide grooves in the device layer.

5. The wafer processing method according to claim 1, further comprising:
   before performing at least the water immersion step and the tape bonding step, a guide groove forming step of forming a single guide groove in the device layer along the intersecting streets from the front side of the wafer by a cutting blade or a laser beam without allowing the guide groove to reach the substrate.

6. The wafer processing method according to claim 1, wherein the mask forming step includes forming a water soluble resin layer on the back side of the wafer and then irradiating the water soluble resin layer to remove the water soluble resin layer along the intersecting streets.

7. The wafer processing method according to claim 5, wherein the guide groove forming step includes forming the single guide groove on a center line of each of the intersecting streets in the device layer.

* * * * *